United States Patent
Mäkinen

(10) Patent No.: US 7,923,353 B2
(45) Date of Patent: Apr. 12, 2011

(54) GETTERING METHOD AND A WAFER USING THE SAME

(75) Inventor: Jari Mäkinen, Espoo (FI)

(73) Assignee: Okmetic Oyj, Vantaa (FI)

( * ) Notice: Subject to any disclaimer, the term of this patent is extended or adjusted under 35 U.S.C. 154(b) by 1131 days.

(21) Appl. No.: 11/389,087

(22) Filed: Mar. 27, 2006

(65) Prior Publication Data

US 2007/0224782 A1     Sep. 27, 2007

(51) Int. Cl.
*H01L 21/321* (2006.01)
(52) U.S. Cl. .......... 438/476; 438/58; 438/143; 438/471; 257/E21.122; 257/E21.143
(58) Field of Classification Search .................... 438/58, 438/143, 310, 402, 471, 476
See application file for complete search history.

(56) References Cited

U.S. PATENT DOCUMENTS

| | | | |
|---|---|---|---|
| 5,240,876 A * | 8/1993 | Gaul et al. | 438/459 |
| 6,890,838 B2 * | 5/2005 | Henley et al. | 438/475 |
| 7,427,773 B2 * | 9/2008 | Chu et al. | 257/19 |
| 2004/0097055 A1 * | 5/2004 | Henley et al. | 438/471 |
| 2007/0158315 A1 * | 7/2007 | Tanaka et al. | 219/121.8 |
| 2007/0166954 A1 * | 7/2007 | Yamazaki et al. | 438/452 |

\* cited by examiner

*Primary Examiner* — Fernando L Toledo
(74) *Attorney, Agent, or Firm* — Birch, Stewart, Kolasch & Birch, LLP

(57) ABSTRACT

It is shown in the invention a method for manufacturing a semiconductor wafer structure with an active layer for impurity removal, which method comprises phases of depositing a first layer on a first wafer surface for providing an active layer, an optional phase of preparation for said first layer for next phase, growing thermal oxide layer on a second wafer, bonding said first and second wafers into a stack, annealing the stack for a crystalline formation in said thermal oxide layer as a second layer, and thinning said first wafer to a pre-determined thickness. The invention concerns also a wafer manufactured according to the method, chip that utilizes such a wafer structure and an electronic device utilizing such a chip.

46 Claims, 2 Drawing Sheets

GETTERING METHOD AND A WAFER USING THE SAME

Figure 1:
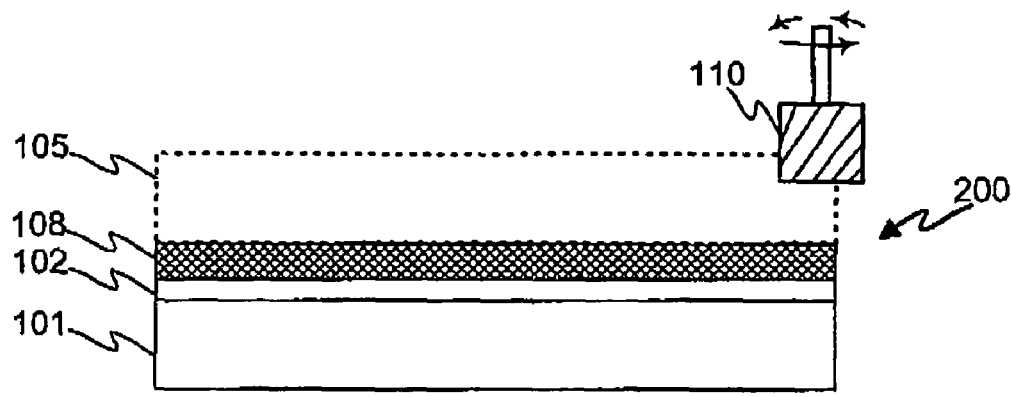

The invention belongs to a technical field of wafer manufacturing in a general level, but in more specific to techniques of controlling impurities in wafer structure as indicated in the preamble of an independent method claim concerning a method for manufacturing a wafer structure. The invention concerns also a wafer structure as indicated in the preamble of an independent claim concerning a wafer. The invention concerns also a chip as indicated in the preamble of an independent claim concerning the chip. The invention concerns also a semiconductor device as indicated in the preamble of an independent claim concerning the semiconductor device.

BACKGROUND

When semiconductor components are made on SOI-wafers impurity behaviour is different to bulk silicon wafers. In bulk silicon wafers there are several gettering techniques available which are effective to remove impurities, especially certain metallic elements, from the active semiconductor area. In SOI wafers, where the structure of the wafer normally consists of a substrate silicon wafer, or a handle silicon wafer, buried oxide and of a silicon layer where semiconductor devices are made, normally used gettering methods are not usually available. The lacking gettering efficiency is limiting the usability of wafers in critical semiconductor applications where, for example, the integrity of gate oxide, and hence the high voltage reliability, is critical. The lack of efficient gettering methods is especially pronounced is such devices, where relatively thick active layers in SOI are used, typically more that few micrometers thick. There is requirement of thick active layers especially in sensor components. To minimize the cost of the sensor component, more often the sensing part, sensing motion are change in the motion, pressure of some other physical phenomenon, and the semiconductor part, processing the information from sensor part, are integrated on the same silicon chip. These sensor components, both the sensing part and semiconductor part, are often used in critical environment or application, as an example in automotives or aviation equipment, where human lives depend on the sensor reliability. This reliability requirement is also very long term, typically well over ten years. It is therefore of paramount importance that the semiconductor part performance is not degraded by impurities, the gettering has to be effective.

It is known that about SOI wafers, having thin active layer, typically from few tens of nanometres to hundreds of nanometres, several techniques are published as such. These SOI wafers are made for example with SmartCut® or similar techniques like plasma immersion process. To improve gettering a thin polysilicon layer between a bond interface and active layer can be used, for example. However, in practise these techniques produce too thin layers suitable for sensor manufacturing. Many of the sensors sense external force, and because of the noise limitations of the amplifying semiconductor part, to get enough sensitivity, according to Newton's law a minimum mass is required. Typically when the sensing element lateral dimensions have to be minimized because of cost reasons, practical active layer thickness is in the order of 10 micrometers or even thicker. In pressure sensors using as a sensing membrane SOI active layer, the durability of the sensor sets minimum practical layer thickness limit. Furthermore, SOI manufacturing techniques based on implantation of ions have practical limitations due to manufacturing cost reasons in ion penetration depth, thus polysilicon layer thickness is in practice limited.

It is possible to use SOI wafers with thin active layers in these applications only if the active layer thickness is increased with an epi-process. However, the cost of the wafers is increasing and the total cost of sensor manufacturing process is too high.

Alternative methods using wafer bonding and back lapping and polishing do not produce enough uniformity in active layer, both within wafer and from wafer to wafer. The requirement commonly is the active layer uniformity of +/−0.5 μm or better in modern component designs.

Known most advantageous SOI wafers for sensor applications with thick active layers are made by bonding wafers together, and then thinning top wafer to a de sired thickness by precision grinding, followed by optional etching and polishing.

In such a way active layer thickness uniformity and overall quality can be produced to meet demanding requirements. Furthermore, what is important and advantageous for the bonding-precision grinding-polishing technique is that when the SOI wafer has buried oxide or other insulating layer, the position of the bond interface and the thickness of the insulating layer can be selected freely.

The patent publication U.S. Pat. No. 6,890,838 discloses a gettering technique for wafers made using a controlled cleaving process for integrated circuits. Therein, the gettering layer is made by implanting using beam line or immersion ion implantation. According to the patent document, a film of material such as polysilicon by way of chemical vapour deposition can be made. A controlled cleaving process can be used to form the wafer.

According to the patent publication U.S. Pat. No. 6,083,324 a gettering layer in a silicon-on-insulator can be formed by implanting gas-forming particles or precipitate-forming particles beneath the active region of the silicon layer and thermally treating the gas forming ions to produce micro bubbles or precipitates within the silicon layer. The micro bubbles and/or precipitates are meant to create trapping sites for mobile impurity species, thus gettering them. The document indicates also that a polysilicon layer is formed on a donor silicon wafer for separating a thin layer of silicon from the donor wafer. According to the patent publication the thin layer of silicon is bonded to a backing wafer. The polysilicon layer can be used to provide a gettering layer between an active silicon layer and the backing wafer.

In a known technique, two layers of separate crystalline and poly-silicon layers are used so for facilitating the implantation of hydrogen through the poly-crystalline silicon to the separate crystalline layer. In known techniques, the thickness of the poly-silicon limits the penetration of the hydrogen implantation into the active layer and thus limits the thickness of the separate crystalline silicon. Although the implantation energy as such can be increased, such increasing becomes impractical at certain energies according to the estimates of a skilled man in the art. In practice, this means that the poly silicon layer cannot be of arbitrary thickness, rather than below a certain layer thickness.

There are known gettering techniques as such for wafers having thick active layer. One possibility is to etch deep trenches for example with RIE technique and diffuse through the sidewalls suitable element, for example phosphorus or boron, U.S. Pat. Nos. 6,830,986 and 5,646,053, for gettering purposes and fill the trenches, and planarize the wafer after that. Although this method is effective it is very expensive, and it requires quite many process steps. It is also possible to diffuse suitable element on the surface of the wafer and to use lateral gettering technique, but again this requires additional process steps and consumes surface area. Furthermore, the gettering efficiency is decreasing with increasing distance from the gettering site.

SUMMARY

It is an object of the invention to solve the problems of the known techniques or at least mitigate the influence of the problems to the final product. The object is achieved by the embodied invention.

Method for manufacturing a semiconductor wafer structure according to the invention is characterized in that what has been said in the characterizing part of an independent claim thereof. A semiconductor wafer structure according to the invention is characterized in that what has been said in the characterizing part of an independent claim thereof. A component for a mechanical, an electrical and/or electromechanical performance, according to the invention is characterized in that what has been said in an independent claim thereof. A semiconductor device according to the invention is characterized in that what has been said in an independent claim thereof. Use of polysilicon layer according to the invention is characterized in that what has been said in an independent claim thereof. A gettering method according to the invention is characterized in that what has been said in an independent claim thereof.

Other embodiments are shown in the dependent claims. Various shown embodiments of the invention are combinable in suitable part.

In an embodiment of the invention a polysilicon layer is added between the active silicon layer and the buried oxide layer. Such polysilicon layer getters such metallic impurities that are introduced during device manufacturing on the device silicon layer side. Impurities introduced from the front surface need not to diffuse through the buried oxide layer forming a diffusion barrier for transition metals in order to get to the gettering polysilicon film.

In an embodiment of the invention, the polysilicon layer between the device silicon layer and the buried oxide layer protects the device area from contamination from the back side of the SOI wafer for metals that have high diffusivity in thermal oxide to diffuse through the buried oxide layer from the back side (for example copper, Cu).

In an embodiment of the invention, adding a polysilicon layer between the device silicon layer and the buried oxide layer improves the gate oxide integrity in metal-oxide-semiconductor devices or reduces leakage currents of bipolar semiconductor devices by gettering mobile impurity atoms. Compared to lateral known gettering techniques, based on ion implantation induced crystalline defects or localized diffusion of dopant atoms in the vicinity of the metal-oxide-semiconductor device channel regions, the technique according to an embodiment of the invention has a great advantage of reducing the size of the devices. This is achieved by having the gettering sites under the device area, which in the embodiments of the invention advantageously spare surface area. Also the distance for impurity atoms to diffuse to the gettering site is constant over the wafer in an embodiment of the invention, whereas within known lateral techniques the gettering efficiency is depending of the distance from the gettering area—i.e. different areas of the semiconductor device have different gettering efficiency in the known techniques.

In a method, according to an embodiment of the invention, for manufacturing a semiconductor wafer structure with an active layer for impurity removal, the method comprises:
 depositing a first layer on a first wafer surface for providing an active layer,
 an optional phase of preparation for said first layer for next phase,
 growing thermal oxide layer on a second wafer,
 bonding said first and second wafers into a stack, and
 thinning said first wafer to a pre-determined thickness Another example of the implementation of the polysilicon layer for gettering of metallic impurities in SOI wafer according to an embodiment of the invention is given below:
 A thin amorphous silicon layer is deposited with low-pressure CVD technique on the wafer surface, which is intended to form the active silicon layer of the SOI wafer. Optionally or in addition, a physical plasma assisted CVD can be used,
 the amorphous layer is polished (chemical-mechanical polishing of silicon),
 the wafer with an amorphous silicon layer is bonded to a handle silicon wafer,
 thermal oxide is grown on the handle wafer before wafer bonding, and the thermal oxide layer forms the buried oxide layer of the SOI wafer,
 the bonded wafer stack is annealed to increase the strength of the bonded interface. The amorphous silicon crystallizes and forms a polysilicon layer,
 the device wafer is thinned to the target thickness of the wafer comprising the active silicon layer polysilicon layer buried under the active silicon layer does not interfere with the thinning process,
 the polysilicon layer can be doped locally, in such a way that the electrical conductivity is locally altered.

According to a further example of an embodient of the invention, the gettering layer as made according to an embodiment of the invention, can be used for an antistiction layer, in addition or alternatively, to the mere gettering function of the layer. This is achieved for example by a phase in which
 a silicon layer is etched away from either of the wafers to form free space between a layer in said wafer and the other wafer in such a manner that the polysilicon layer forms layer between said free space and a layer of at least one of said wafers.

In an embodiment of the invention, the polysilicon layer can be used, as an anti-stiction layer. In an embodiment, the layer e.g. by first annealing it after a sacrificial oxide removal to grow grain size and then thermally oxidising it, and then optionally removing the oxide—in such a way the polysilicon surface can be roughened suitable to be used in the antistiction. The use of an antistiction layer can be embodied for example, but not limiting only thereto, in mechanical and/or electromechanical applications that can bend and/or twist a micromechanical structure near a surface that potentially can cause stiction of said micromechanical structure.

In order to give examples on the embodiment of the invention some of them are described below as examples only without any intention to limit the number of embodiments.

In an embodiment of the invention the bonding can be made as a low-temperature bonding, but in another embodiment as a high-temperature bonding.

The stack can be annealed in an embodiment of the invention, for bonding, but also in order to progress polysilicon formation from amorphous silicon.

In an embodiment of the invention, the polysilicon film can be formed by first depositing an amorphous silicon layer on a wafer for the purpose that the silicon forms a polycrystalline layer when annealed at high temperature, or one can deposit straight a polysilicon layer to start with.

In an embodiment of the invention, the amorphous silicon/ polysilicon layer can be undoped or it can be intentionally doped.

In an embodiment of the invention, in the example above, deposition of polysilicon layer was based on low-pressure CVD, but the technique is not limited to that and other techniques of forming polysilicon can be used.

In an embodiment of the invention, the chemical-mechanical polishing can be omitted.

In an embodiment of the invention, the thickness of the polysilicon layer can be from <0.1 µm to several micrometers.

In an embodiment of the invention, there can be thermal annealing steps other than the bond-anneal to reduce or to control the residual stress in the polysilicon layer or control the chemical composition of the film.

In an embodiment of the invention, the SOI structure can include other layers in addition to the polysilicon layer e.g. to control the stress in the system In an embodiment of the invention, parts of the wafer can be etched away in order to make a bending element, in which an anti-stiction layer can be used to prevent permanent attachment of the bending element and an opposing substrate layer.

Figure 2:
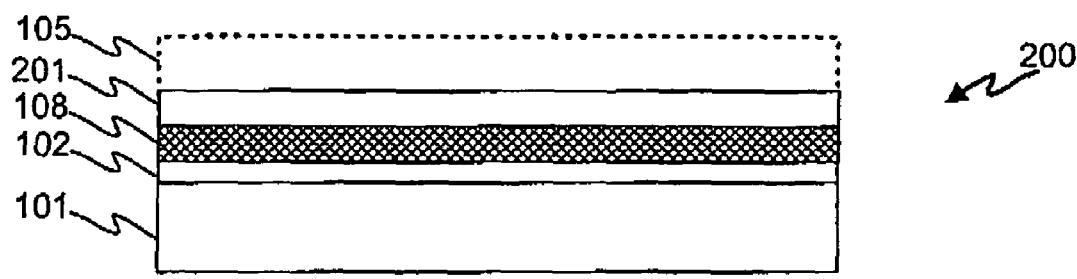
Figure 3:
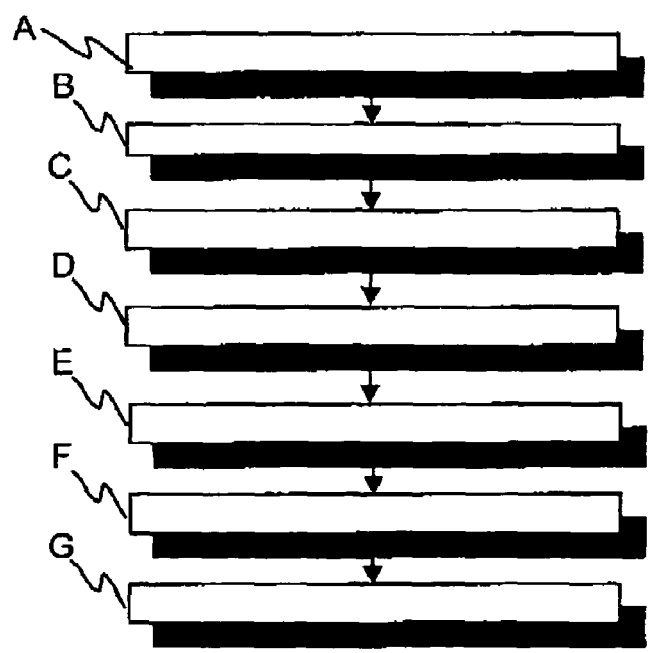
Figure 4:
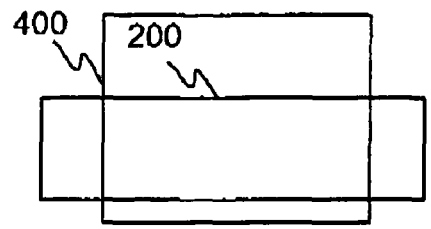
Figure 5:
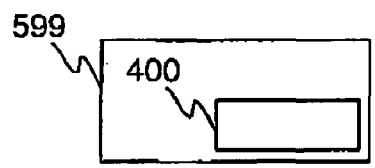
Figure 6:
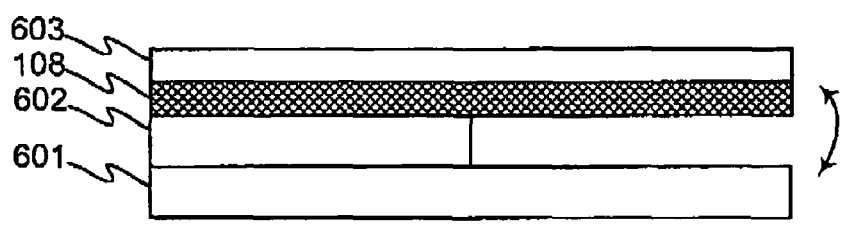
Figure 7:
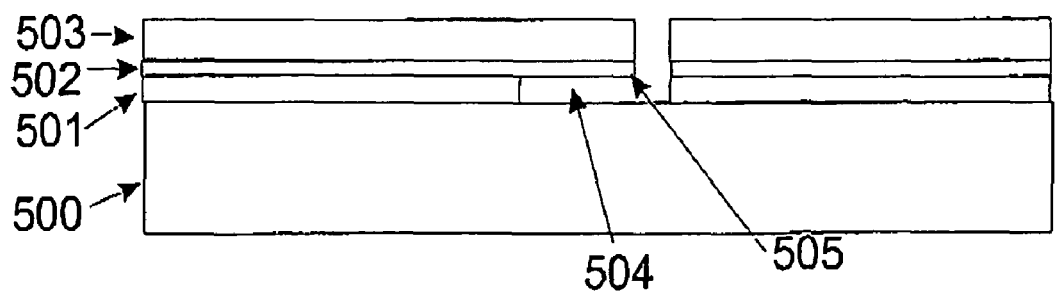

In the following detailed description embodiments as examples of the invention are explained by referring to the following figures in which FIG. 1 illustrates a wafer manufacturing according to an embodiment of the invention, FIG. 2 illustrates a wafer according to an embodiment of the invention, FIG. 3 illustrates a wafer manufacturing method according to an embodiment of the invention, FIG. 4 illustrates a component according to an embodiment of the invention, FIG. 5 illustrates a semiconductor device according to an embodiment of the invention, FIG. 6 illustrates embodiments of the invention, and FIG. 7 illustrates a further embodiment of the invention

DETAILED DESCRIPTION OF AN ENSEMBLE OF EMBODIMENTS

The same numbers are used for alike structures, which are not necessary identical, but can have a difference, which a skilled man in the art recognizes according to the context. The parts and/or structures in the Figures are not necessarily in scale, but are used for illustrative purposes only.

SOI wafers are used to be round and their diameter is typically 100, 125, 150, 200 or 300 mm, etc according to the practice known to a skilled man in the art at the priority date of this document.

However, a skilled man realizes from the text as read and understood that the shape and/or the size as such are not limiting, but are instead given as examples of wafers. According to an embodiment of the invention, the wafers can have a different planar shape, conical for instance, but however preferably of regular shape.

Irregularly shaped wafers can be used as such, without leaving from the scope of the embodiments of the invention, although such a shape may raise further issues for handling of the wafers as such. Nevertheless, according to an embodiment, the wafer, chip or device according to an embodiment of the invention can be implemented as an irregularly shaped object as such, but may be not so advantageous. According to a further embodiment of the invention, the wafer can be a non-planar type, i.e. as a segment of a sphere or ellipsoid, so having an additional surface in comparison to a flat wafer. Because of the surface curvature in macroscopic scale, for the integrated structures if compared to same diameter ordinary SOI wafer of planar type, integration degree of wafer layers can be thus increased in comparison to a mere flat surface.

In an exemplary embodiment of the invention in FIGS. 1 and/or 2, the layer 101 is a handle wafer of SOI-type. The layer 102 is a buried silicon dioxide layer (BOX) and the layer 108 is a top layer in an active layer formed from other wafer comprising the layers 105 and 108, which wafer is bonded on top of the oxidized handle and then thinned 110 down to desired thickness. The thinning is indicated by the mechanical thinning tool 101 as an example in the FIG. 1, as being arranged to remove at least a part of the layer 105, which is thus indicated by a dashed line, also for the same reason in FIG. 2, in which the layer 105 has been grinded 110 (illustrated in FIG. 1), away so making the layer 201 as a residual layer.

According to an embodiment of the invention a thin polysilicon layer is embodied as in FIG. 2 (layer thickness only illustrative but not in scale). The layer 108 is of polysilicon, residing between the active layer 201 in FIG. 2 and BOX 102, and this layer 108 getters the impurities from front 201 surface.

FIG. 3 illustrates a method according to an embodiment of the invention for manufacturing a semiconductor wafer structure with an active layer for impurity removal. The method comprises phases comprising:

depositing (A) a first layer on a first wafer surface for providing an active layer, an optional phase of preparation (B) for said first layer for next phase, growing (C) thermal oxide layer on a second wafer, bonding (D) said first and second wafers into a stack, annealing (E) the stack for a crystalline formation in said thermal oxide layer as a second layer, and thinning said (F) first wafer to a pre-determined thickness.

optionally etching (G) away a layer there between the polysilicon and a wafer layer of at least one of said wafers.

As skilled man in the art knows when read and understood the embodiments of the invention, some of the phases can be performed in parallel and/or in different order, such for instance the preparations of the handle wafer and the bonding wafer, the second wafer.

The etching for a structure that uses a free space somewhere there between the layers of the wafer parts can be made before the bonding. A suitable embodiment for instance can be embodied as a switch in very small scale as a micromechanical switch.

In the exemplary embodiments of the invention above, deposition of polysilicon layer was embodied as based on low-pressure CVD, but the technique is not limited only thereto, and thus other techniques of forming polysilicon as such can be used. The thermal annealing step can be implemented at least optionally in another way than the bond anneal to reduce or to control the residual stress in the polysilicon layer or to control the chemical composition of the film.

According to an embodiment of the invention, a polysilicon layer can be used as an anti-stiction layer as formed according to an embodiment of the invention and can be formed by the polysilicon layer, by first annealing it after sacrificial oxide removal to grow grain size and then thermally oxidizing it, and then removing the oxide. In such a way the polysilicon surface can be roughened. As an advantage, such a layer can be used also as a gettering layer. According to an alternative embodiment of the invention the thermal annealing steps can be at least partly used instead of the bond anneal to reduce or to control the residual stress in the polysilicon layer or control the chemical composition of the film.

FIG. 4 illustrates a component 400 for a mechanical, an electrical and/or electromechanical performance, or a chip 400 for the same, according to an embodiment of the invention. The chip is implemented at least partly by a wafer structure 200, from which the by-box-indicated part of the wafer 200 the chip 400 forms. The sketching manner is just illustrating, that at least part of the wafer has been used for said component or chip. Such a component or chip can be implemented to comprise a circuit of discrete or integrated semiconductor components, optical element, mechanical element and/or a combination of the mentioned. Such a chip can comprise a sensor, actuator, transistor, transistor circuit, semi-conductor circuit, FET, MOSFET, diode, detector crystal, sensor, switch, transducer or a combination thereof, for example. However, a skilled man in the art realizes from the embodiments of the invention, that the list is only an example not restrictive to the mentioned. FIG. 5 illustrates a semiconductor device 599 according to an embodiment of the invention that utilizes the chip or a component 400 illustrated in FIG. 4.

In FIG. 6 it is shown schematically an embodiment of the invention that is related to an anti-stiction application to prevent the layers 603 and 601 to permanently being attached together, by an anti-stiction layer 108 made of polysilicon. The layer 602 correspond a layer 102, or can be any layer that is available for separating the layer 601 and the 603 with the polysilicon layer 108 from each other in the specific embodiment. Such a polysilicon layer can be made with a rough surface to prevent van der Waals, or other type adhesive forces to cause permanent attachment of layers 603 and 601. The polysilicon layer can be doped with a suitable dopant for arranging suitable conductance for the polysilicon in the application. For instance, the layer 603 can be a part of a micromechanical beam on a substrate in a stack comprising the layers 602 and 108 to form a switch for instance as implemented by a bending structure further implemented by the beam comprising the layers 603 and 108. Such a beam can be planned to be a bending beam for instance as a result of applied electric field therein in the structure. The potential bending is demonstrated by the two-end-arrow-line at the right in the FIG. 6.

In an embodiment of the invention the anti-stiction layer comprising polysilicon layer 108 acts also as a gettering layer to getter impurities from the other layers 601, 602, 603. However, the order or number of the layers is not limited by the example, and thus there can be also other layers in the structure, that can be also gettered by the polysilicon layer. In an embodiment of the invention doping of a layer by a dopant is used to arrange a suitable diffusion coefficient to yield a net transference of an impurity through it into a polysilicon layer used as a gettering layer.

According to an embodiment of the invention, a wafer comprising an active layer made of at least partly of polysilicon has essentially uniform thickness above 0.1 µm. According to an embodiment of the invention, a wafer comprising an active layer made of at least partly of polysilicon has essentially uniform thickness above 0.5 µm. According to an embodiment of the invention, a wafer comprising an active layer made of at least partly of polysilicon has essentially uniform thickness above 1.01 µm. According to an embodiment of the invention, a wafer comprising an active layer made of at least partly of polysilicon has essentially uniform thickness above 2 µm. According to an embodiment of the invention, a wafer comprising an active layer made of at least partly of polysilicon has essentially uniform thickness above 5 µm. According to an embodiment of the invention the wafer comprising polysilicon layer with essentially uniform predetermined thickness has a layer thickness tolerance of less than 30%. According to an embodiment of the invention the wafer comprising polysilicon layer with essentially uniform predetermined thickness has a layer thickness tolerance of less than 10%. According to an embodiment of the invention the wafer comprising polysilicon layer with essentially uniform pre-determined thickness has a layer thickness tolerance of less than 1%.

In FIG. 7 similar structure as in FIG. 6 has been further embodied in as manufactured on the substrate 500. The layer 501 is a buried oxide layer, the layer 502 comprises polysilicon layer, which can be formed from an initially amorphous silicon, the layer 503 is an active layer originating to a thinned silicon layer from second wafer, layer 504 is a void area where oxide is removed to release active layer and polysilicon layer and the layer 505 is exposed polysilicon layer surface treated in such a way, that stiction of the released area above 504 to the substrate 500 is prevented, although the void distance were in a micron scale layer.

The invention claimed is:

1. A method for manufacturing a semiconductor wafer structure, the method comprising:
    depositing a polysilicon layer or an amorphous silicon layer, which is at least 0.2 µm thick, on a surface of a first wafer in order to provide a gettering layer capable of providing trapping sites for mobile impurity species;
    growing an oxide layer on a surface of a second wafer;
    bonding the polysilicon layer or the amorphous silicon layer of the first wafer to the oxide layer of the second wafer to form a wafer stack; and
    thinning the first wafer to obtain the semiconductor wafer structure.

2. The method of claim 1, wherein the first wafer is thinned to a pre-determined thickness, and the first wafer further comprises a semiconductor layer having a top surface and being bonded to a substrate thereof to form the multilayer semiconductor wafer structure.

3. The method of claim 1, wherein the polysilicon layer or the amorphous silicon layer is deposited in a low-pressure chemical vapor deposition (CVD)-process and/or a physical plasma CVD-process.

4. The method of claim 1, further comprising annealing the wafer stack.

5. The method of claim 1, further comprising annealing the wafer stack in multiple steps.

6. The method of claim 5, wherein the annealing of the wafer stack comprises annealing in a first temperature during a first time duration, and optionally further annealing in a second temperature during a second time duration.

7. The method of claim 6, wherein the annealing of the wafer stack further comprises ramping the annealing temperature from the first temperature to the second temperature, provided that the first temperature is different than the second temperature.

8. A method of claim 1, wherein a polysilicon layer or an amorphous silicon layer is deposited on a surface of the oxide layer on the second wafer, and then the first wafer is bonded to the second wafer.

9. The method of claim 2, further comprising trapping the mobile impurity species, by the gettering layer, into the trapping sites for the mobile impurity species from the semiconductor layer and from a layer of the first wafer.

10. The method of claim 2, further comprising trapping the mobile impurity species, by the gettering layer, into the trapping sites for the mobile impurity species from the semiconductor layer and from a layer of the second wafer.

11. The method of claim 2, further comprising trapping mobile impurity species, by the gettering layer, into the trapping sites for the mobile impurity species from the semiconductor layer and from a layer of the first wafer or a layer of the second wafer, wherein the gettering layer is arranged to getter the mobile impurity species only from the layer of one of the first wafer or the second wafer.

12. The method of claim 1, wherein the gettering layer is arranged to decrease a concentration of the mobile impurity species in a layer of the semiconductor wafer structure other than the gettering layer.

13. The method of claim 2, wherein the semiconductor layer comprises monocrystalline silicon, and the depositing step deposits the polysilicon layer.

14. The method of claim 1, wherein the polysilicon layer is intentionally doped with a dopant.

15. The method of claim 1, wherein the depositing step deposits the amorphous silicon layer.

16. The method of claim 1, wherein the amorphous silicon is intentionally doped with a dopant.

17. The method of claim 1, further comprising polishing the polysilicon layer or the amorphous silicon layer, wherein the polishing comprises at least one of chemical polishing, mechanical polishing and chemical-mechanical polishing.

18. The method of claim 1, wherein the growing of the oxide is implemented thermally for the oxide layer to be used for formation of a buried oxide layer.

19. The method of claim 1, wherein the polysilicon layer or the amorphous silicon layer and the oxide layer are bonded together.

20. The method of claim 1, further comprising depositing a polysilicon layer or an amorphous silicon layer on the oxide layer.

21. The method of claim 1, wherein the bonding occurs at a temperature less than 450° C.

22. The method of claim 1, wherein the bonding occurs at a temperature between 450° C. and 1000° C.

23. The method of claim 1, wherein the bonding occurs at a temperature over 1000° C.

24. The method of claim 1, further comprising depositing the polysilicon layer directly as polysilicon on the first wafer to form an active layer.

25. The method of claim 1, further comprising forming an active layer so that the polysilicon layer or the amorphous silicon layer is left undoped.

26. The method according to claim 1, further comprising removing a buried oxide from the wafer stack at least locally and thereby roughening a stress relieved surface of the polysilicon layer or the amorphous silicon layer.

27. The method according to claim 26, wherein the roughening of the stress relieved surface thereof further comprises thermally oxidizing the stress relieved surface of the polysilicon layer or the amorphous silicon layer, and then optionally etching an oxidation layer formed by the thermal oxidation to achieve a certain roughness for a remaining structure.

28. A semiconductor wafer structure manufactured by a method comprising:
depositing a polysilicon layer or an amorphous silicon layer, which is at least 0.2 µm thick, on a surface of a first wafer in order to provide a gettering layer capable of providing trapping sites for mobile impurity species;
growing an oxide layer on a surface of a second wafer;
bonding the polysilicon layer or the amorphous silicon layer of the first wafer to the oxide layer of the second wafer to form a wafer stack; and
thinning the first wafer to obtain the semiconductor wafer structure.

29. The semiconductor wafer structure according to claim 28, further comprising an active layer, in a plurality of layers comprising at least one layer of the semiconductor wafer structure, with a diffusion coefficient chosen to yield a net flux of an impurity from the at least one layer to the active layer.

30. The semiconductor wafer structure according to claim 28, wherein the amorphous silicon layer is deposited.

31. The semiconductor wafer structure of claim 29, wherein the polysilicon layer is deposited with essentially uniform thickness of above 0.5 µm.

32. The semiconductor wafer structure of claim 29, wherein the polysilicon layer is deposited with essentially uniform pre-determined thickness with a layer thickness tolerance of less than 30%.

33. The semiconductor wafer structure of claim 28, comprising a layer of the semiconductor wafer structure having at least one dopant from the 3rd group of elements.

34. The semiconductor wafer structure of claim 28, comprising a layer of the semiconductor wafer structure having at least one dopant from the $5^{th}$ group of elements.

35. The semiconductor wafer structure of claim 28, comprising a layer of the wafer structure having at least one of the following dopants As, B, P, and Sb.

36. The semiconductor wafer structure of claim 28, comprising a dopant in a layer arranged into a predefined phase to control stress in a layer of the semiconductor wafer structure.

37. The semiconductor wafer structure according to claim 28, wherein the semiconductor wafer structure comprises a silicon phase with a certain orientation.

38. The semiconductor wafer structure according to claim 37, wherein the certain orientation according to the Miller-index notation is at least one of (100), (110), and (111).

39. The semiconductor wafer structure according to claim 38, wherein the certain orientation is a rotated and/or tilted orientation.

40. A method comprising:
using a polysilicon layer as an anti-stiction layer in a semiconductor wafer structure, wherein the semiconductor wafer structure comprises,
a first wafer,
the polysilicon layer, which is at least 0.2 µm thick, on a surface of the first wafer in order to provide a gettering layer capable of providing trapping sites for mobile impurity species,
a second wafer, and
an oxide layer on a surface of the second wafer, wherein the polysilicon layer of the first wafer is bonded to the oxide layer of the second wafer to form a wafer stack.

41. A method comprising:
using a polysilicon layer being a gettering layer as an active layer in a semiconductor wafer structure, wherein the semiconductor wafer structure comprises,
a first wafer,
the polysilicon layer, which is at least 0.2 µm thick, on a surface of the first wafer in order to provide the gettering layer capable of providing trapping sites for mobile impurity species,
a second wafer, and
an oxide layer on a surface of the second wafer, wherein the polysilicon layer of the first wafer is bonded to the oxide layer of the second wafer to form a wafer stack.

42. A method comprising:
gettering an impurity from at least one of a second layer on a second substrate, the second substrate, and a first substrate, of a wafer stack structure,
wherein the wafer stack structure is formed by respectively depositing a first layer on the first substrate and the second layer on the second substrate, and bonding the first and second substrates along respective first and second surfaces to form the wafer stack structure, from which the second substrate is at least partly thinned away, and the first layer comprises polysilicon arranged to getter the impurity from the at least one of the second layer on the second substrate, the second substrate, and the first substrate.

43. The method of claim 42, wherein the gettering of the impurity is extended to continue during at least partly through a lifetime of the wafer stack structure and/or a component made of the wafer stack structure.

44. A semiconductor device comprising:
a semiconductor wafer structure, wherein the semiconductor wafer structure is manufactured by a method comprising:
depositing a polysilicon layer or an amorphous silicon layer, which is at least 0.2 µm thick, on a surface of a first wafer in order to provide a gettering layer capable of providing trapping sites for mobile impurity species;
growing an oxide layer on a surface of a second wafer;
bonding the polysilicon layer or the amorphous silicon layer of the first wafer to the oxide layer of the second wafer to form a wafer stack; and
thinning the first wafer to a pre-determined thickness to obtain the semiconductor wafer structure.

45. The semiconductor device according to claim 44, wherein the semiconductor device comprises at least one of a transistor, a transistor circuit, a field-effect transistor (FET), a metal-oxide-semiconductor field-effect transistor (MOSFET), a diode, a detector crystal, a sensor, and a transducer.

46. The semiconductor device according to claim 44, wherein the semiconductor device comprises at least one of a circuit of discrete or integrated semiconductor components, an optical element, and a mechanical element.

* * * * *